US012563981B2

(12) United States Patent
Horita et al.

(10) Patent No.: US 12,563,981 B2
(45) Date of Patent: Feb. 24, 2026

(54) METHOD OF PROCESSING SUBSTRATE, SUBSTRATE PROCESSING APPARATUS, RECORDING MEDIUM, AND METHOD OF MANUFACTURING SEMICONDUCTOR DEVICE

(71) Applicant: KOKUSAI ELECTRIC CORPORATION, Tokyo (JP)

(72) Inventors: Hideki Horita, Toyama (JP); Haojie Kang, Toyama (JP); Masanao Osanai, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 770 days.

(21) Appl. No.: 17/199,833

(22) Filed: Mar. 12, 2021

(65) Prior Publication Data

US 2021/0202242 A1     Jul. 1, 2021

Related U.S. Application Data

(63) Continuation of application No. PCT/JP2019/028018, filed on Jul. 17, 2019.

(30) Foreign Application Priority Data

Oct. 31, 2018     (JP) ................................. 2018-205658

(51) Int. Cl.
*H01L 21/02*          (2006.01)
*C23C 16/44*          (2006.01)
(Continued)

(52) U.S. Cl.
CPC .... *H01L 21/02271* (2013.01); *C23C 16/4412* (2013.01); *C23C 16/45502* (2013.01);
(Continued)

(58) Field of Classification Search
CPC ......... H01L 21/02271; H01L 21/67023; H01L 21/67253; H01L 21/0228; H01L 21/0214;
(Continued)

(56) References Cited

U.S. PATENT DOCUMENTS 5,896,875 A * 4/1999 Yoneda ..................... B08B 3/02
                                                                134/2
6,158,382 A * 12/2000 Segi ................... C23C 16/5093
                                                            118/723 VE
(Continued)

FOREIGN PATENT DOCUMENTS

JP          2007-019145 A       1/2007
JP          2014-236129 A      12/2014
(Continued)

OTHER PUBLICATIONS

Korean Office Action issued on Feb. 9, 2023 for Korean Patent Application No. 10-2021-7007707.
(Continued)

*Primary Examiner* — Su C Kim
(74) *Attorney, Agent, or Firm* — Volpe Koenig

(57)                ABSTRACT

There is provided a technique that includes: forming a film on a substrate in a process chamber by performing a cycle a predetermined number of times, the cycle including non-simultaneously performing: (a) supplying a precursor from a first supplier to the substrate and exhausting the precursor from an exhaust port installed opposite to the first supplier with the substrate interposed between the exhaust port and the first supplier; and (b) supplying a reactant from a second supplier to the substrate and exhausting the reactant from the exhaust port, wherein in (a), inert gas is supplied into the process chamber from a third supplier installed at a region, which is a region on a side of the exhaust port among a plurality of regions partitioned in the process chamber by a
(Continued)

bisector perpendicular to straight line connecting the first supplier and the exhaust port in a plane view.

19 Claims, 9 Drawing Sheets

(51) Int. Cl.
| | |
|---|---|
| *C23C 16/455* | (2006.01) |
| *C23C 16/52* | (2006.01) |
| *H01L 21/67* | (2006.01) |
| *H01L 21/687* | (2006.01) |

(52) U.S. Cl.
CPC ........ *C23C 16/52* (2013.01); *H01L 21/67023* (2013.01); *H01L 21/67253* (2013.01); *H01L 21/68764* (2013.01)

(58) Field of Classification Search
CPC ......... H01L 21/02126; H01L 21/68764; C23C 16/4412; C23C 16/45502; C23C 16/52; C23C 16/308; C23C 16/45527; C23C 16/45546; C23C 16/45578; C23C 16/45548; C23C 16/4408
USPC .......................................................... 438/5
See application file for complete search history.

(56) References Cited

U.S. PATENT DOCUMENTS

| | | | | | |
|---|---|---|---|---|---|
| 6,903,025 | B2 * | 6/2005 | Mizushima | ......... | C23C 16/4405 |
| | | | | | 438/785 |
| 7,604,424 | B2 * | 10/2009 | Shigemori | ........ | H01L 21/67225 |
| | | | | | 396/611 |
| 7,894,059 | B2 * | 2/2011 | Otsuki | .............. | H01L 21/67069 |
| | | | | | 427/458 |
| 9,469,899 | B2 * | 10/2016 | Huotari | ................... | C23C 16/34 |
| 2007/0010071 | A1 | 1/2007 | Hiroyuki | | |
| 2014/0179085 | A1 * | 6/2014 | Hirose | ............. | H01L 21/02529 |
| | | | | | 118/715 |
| 2014/0357058 | A1 | 12/2014 | Kosuke et al. | | |
| 2018/0076017 | A1 | 3/2018 | Yoshitomo et al. | | |
| 2019/0345605 | A1 | 11/2019 | Hidetoshi | | |

FOREIGN PATENT DOCUMENTS

| | | |
|---|---|---|
| JP | 2018-046129 A | 3/2018 |
| KR | 2018-0116224 A | 10/2018 |
| WO | 2018/154823 A1 | 8/2018 |

OTHER PUBLICATIONS

PCT/JP2019/028018 International Search Report, Oct. 21, 2019, 2 pgs.

Singapore Search Report issued on Jun. 30, 2022 for Singapore Patent Application No. 11202102590Y.

Singapore Written Opinion issued on Jun. 30, 2022 for Singapore Patent Application No. 11202102590Y.

Japanese Office Action issued on Nov. 16, 2021 for Japanese Patent Application No. 2020-554763.

\* cited by examiner

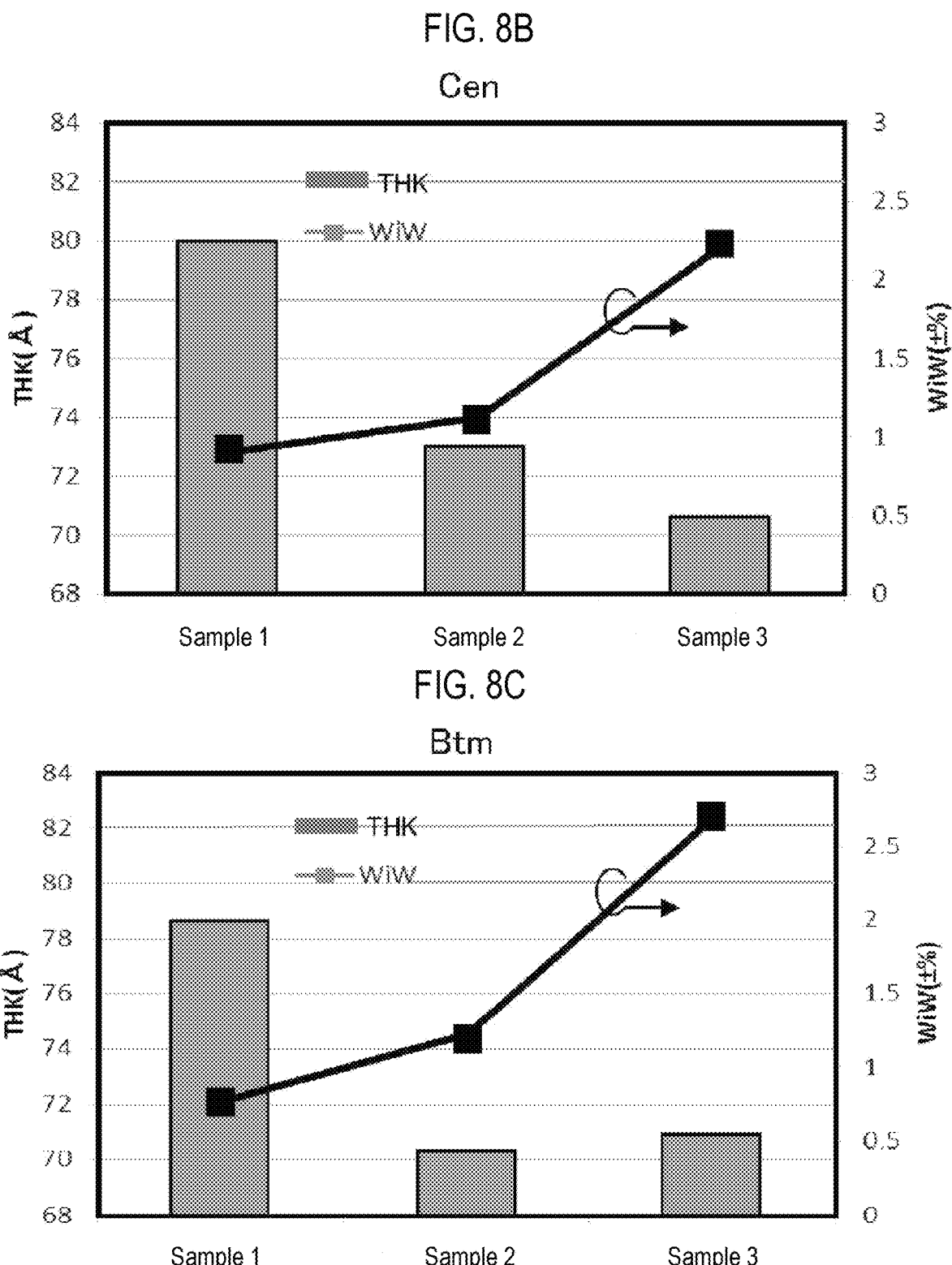

METHOD OF PROCESSING SUBSTRATE, SUBSTRATE PROCESSING APPARATUS, RECORDING MEDIUM, AND METHOD OF MANUFACTURING SEMICONDUCTOR DEVICE

CROSS-REFERENCE TO RELATED APPLICATION

The application is a Bypass Continuation Application of PCT International Application No. PCT/JP2019/028018, filed on Jul. 17, 2019 and designating the United States, the international application being based upon and claiming the benefit of priority from Japanese Patent Application No. 2018-205658, filed on Oct. 31, 2018, the entire content of which is incorporated herein by reference.

TECHNICAL FIELD

The present disclosure relates to a method of manufacturing a semiconductor device, a substrate processing apparatus, and a recording medium.

BACKGROUND

In the related art, as a process of manufacturing a semiconductor device, a process of forming a film on a substrate is often carried out by supplying a precursor and a reactant to the substrate.

SUMMARY

The present disclosure provides some embodiments of a technique capable of controlling film thickness uniformity of a film formed on a substrate in a plane of the substrate.

According to some embodiments of the present disclosure, there is provided a technique that includes: forming a film on a substrate in a process chamber by performing a cycle a predetermined number of times, the cycle including non-simultaneously performing: (a) supplying a precursor from a first supplier to the substrate in the process chamber and exhausting the precursor from an exhaust port installed opposite to the first supplier with the substrate interposed between the exhaust port and the first supplier; and (b) supplying a reactant from a second supplier to the substrate in the process chamber and exhausting the reactant from the exhaust port, wherein in (a), an inert gas is supplied into the process chamber from a third supplier installed at a region, which is a region on a side of the exhaust port among a plurality of regions partitioned in the process chamber by a bisector perpendicular to a straight line connecting the first supplier and the exhaust port in a plane view.

BRIEF DESCRIPTION OF DRAWINGS

The accompanying drawings, which are incorporated in and constitute a part of the specification, illustrate embodiments of the present disclosure.

FIG. 1 is a schematic configuration diagram of a vertical process furnace of a substrate processing apparatus suitably used in embodiments of the present disclosure, in which a portion of the process furnace is shown in a vertical cross-sectional view.

FIG. 4 is a diagram illustrating an example of a film-forming sequence according to some embodiments of the present disclosure.

FIG. 7 is a diagram illustrating an exemplary modification of a film-forming sequence according to some embodiments of the present disclosure.

FIG. 8B is a diagram illustrating an average film thickness and a film thickness uniformity of a film formed on a substrate arranged at a center of a substrate arrangement region in a plane of the substrate, and FIG. 8C is a diagram illustrating an average film thickness and a film thickness uniformity of a film formed on a substrate arranged in a lower portion of a substrate arrangement region in a plane of the substrate.

DETAILED DESCRIPTION

Figure 2:
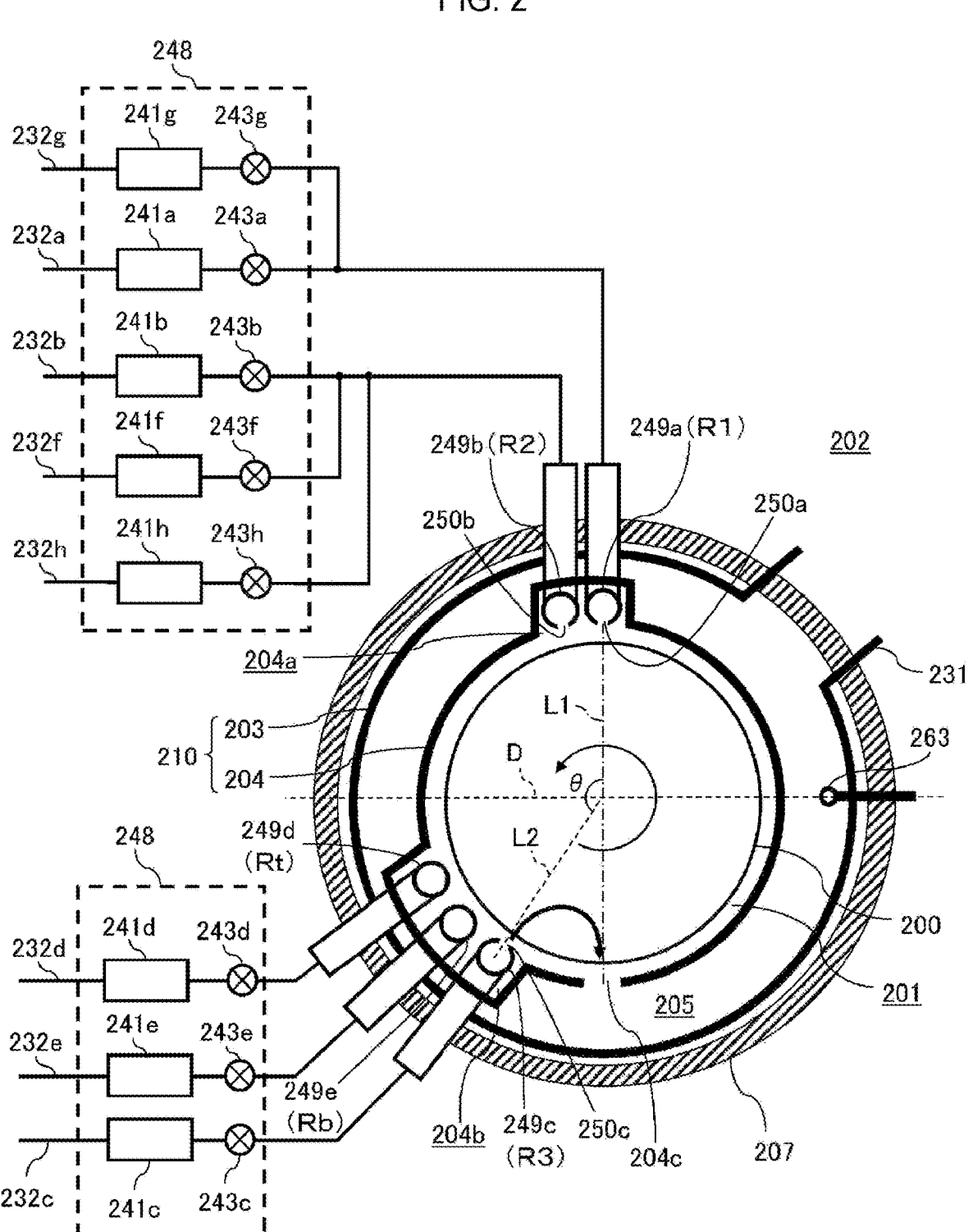
FIG. 2 is a schematic configuration diagram of the vertical process furnace of the substrate processing apparatus suitably used in some embodiments of the present disclosure, in which a portion of the process furnace is shown in a cross-sectional view taken along line A-A in FIG. 1.

Reference will now be made in detail to various embodiments, examples of which are illustrated in the accompanying drawings. In the following detailed description, numerous specific details are set forth to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of the Present Disclosure

Some embodiments of the present disclosure will now be described with reference to FIGS. 1 to 5.

(1) Configuration of the Substrate Processing Apparatus

Figure 1:
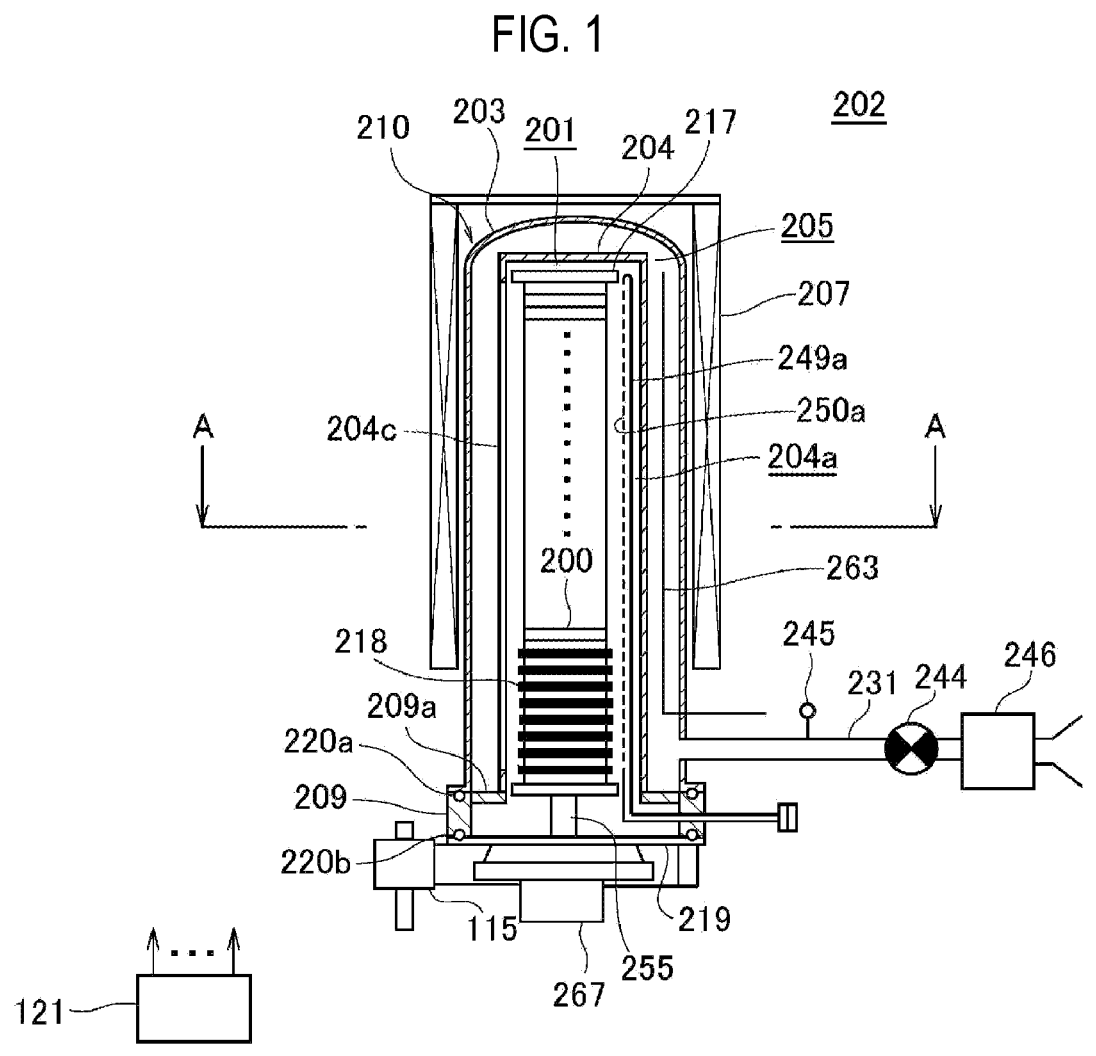

As illustrated in FIG. 1, a process furnace 202 includes a heater 207 as a heating mechanism (temperature regulation part). The heater 207 has a cylindrical shape and is supported by a holding plate to be vertically installed. The heater 207 functions as an activation mechanism (an excitation part) configured to thermally activate (excite) a gas.

A reaction tube 210 is disposed inside the heater 207 to be concentric with the heater 207. The reaction tube 210 has a double tube configuration including an inner tube 204 as an inner reaction tube and an outer tube 203 as an outer reaction tube concentrically surrounding the inner tube 204. Each of the inner tube 204 and the outer tube 203 is made of a heat resistant material, e.g., quartz ($SiO_2$), silicon carbide (SiC)

or the like, and has a cylindrical shape with its upper end closed and its lower end opened.

A process chamber 201 in which wafers 200 as substrates are processed is formed in a hollow cylindrical portion of the inner tube 204. The process chamber 201 is configured to accommodate the wafers 200 in such a state that the wafers 200 are arranged between one end side (lower side) and the other end side (upper side) in the process chamber 201. A region in which a plurality of wafers 200 is arranged in the process chamber 201 will be referred to as a substrate arrangement region (wafer arrangement region). Furthermore, a direction in which the wafers 200 are arranged in the process chamber 201 will be referred to as a substrate arrangement direction (wafer arrangement direction).

Each of the inner tube 204 and the outer tube 203 is supported by a manifold 209 from below. The manifold 209 is made of a metal material such as stainless steel (SUS), and has a cylindrical shape with its upper and lower ends opened. An annular flange 209a, which is made of a metal material such as SUS and extends to protrude toward an inside of the manifold 209 in a radial direction, is installed at an upper end of an inner wall of the manifold 209. A lower end of the inner tube 204 is formed to make contact with an upper surface of the flange 209a. A lower end of the outer tube 203 is formed to make contact with an upper end of the manifold 209. An O-ring 220a as a seal member is installed between the outer tube 203 and the manifold 209. A lower end opening of the manifold 209 is configured as a furnace opening of the process furnace 202, and is hermetically sealed by a disc-shaped seal cap 219 as a lid when a boat 217 is raised by a boat elevator 115 as described below. An O-ring 220b as a seal member is installed between the manifold 209 and the seal cap 219.

A ceiling portion of the inner tube 204 has a flat shape, and a ceiling portion of the outer tube 203 has a dome shape. When the ceiling portion of the inner tube 204 has a dome shape, a gas supplied into the process chamber 201 is likely to flow into the internal space of the dome portion in the ceiling portion of the inner tube 204 without flowing among the wafers 200. Since the ceiling portion of the inner tube 204 has a flat shape, the gas supplied into the process chamber 201 is allowed to efficiently flow among the wafers 200. By making a small clearance (space) between the ceiling portion of the inner tube 204 and a ceiling plate of the boat 217 to be described below, for example, by setting the clearance to a substantially same size as the arrangement interval (pitch) of the wafers 200, the gas is allowed to efficiently flow among the wafers 200.

As illustrated in FIG. 2, nozzle accommodating chambers 204a and 204b are formed on a sidewall of the inner tube 204. Each of the nozzle accommodating chambers 204a and 204b has a channel shape protruding outward of the inner tube 204 in the radial direction from the sidewall of the inner tube 204 and extending along a vertical direction. Inner walls of the nozzle accommodating chambers 204a and 204b each constitute a part of the inner wall of the process chamber 201. The nozzle accommodating chamber 204a and the nozzle accommodating chamber 204b are respectively disposed at positions spaced from each other by a predetermined distance along the inner wall of the inner tube 204, that is, along the outer periphery of the wafers 200 accommodated in the process chamber 201.

A nozzle 249a as a first supplier and a nozzle 249b as a second supplier are respectively accommodated in the nozzle accommodating chamber 204a. A nozzle 249c as a third supplier, and nozzles 249d and 249e are respectively accommodated in the nozzle accommodating chamber 204b.

The nozzles 249a to 249e are installed to extend upward from a lower portion to an upper portion of the nozzle accommodating chambers 204a and 204b, i.e., along the wafer arrangement direction. That is, the nozzles 249a to 249e are installed at a lateral side of the wafer arrangement region, namely in a region which horizontally surrounds the wafer arrangement region, to extend along the wafer arrangement region. The nozzles 249d and 249e may be regarded as being included in the third supplier. In the present disclosure, the nozzles 249a, 249b, 249c, 249d and 249e will be referred to as R1, R2, R3, Rt, and Rb, respectively.

Figure 5:
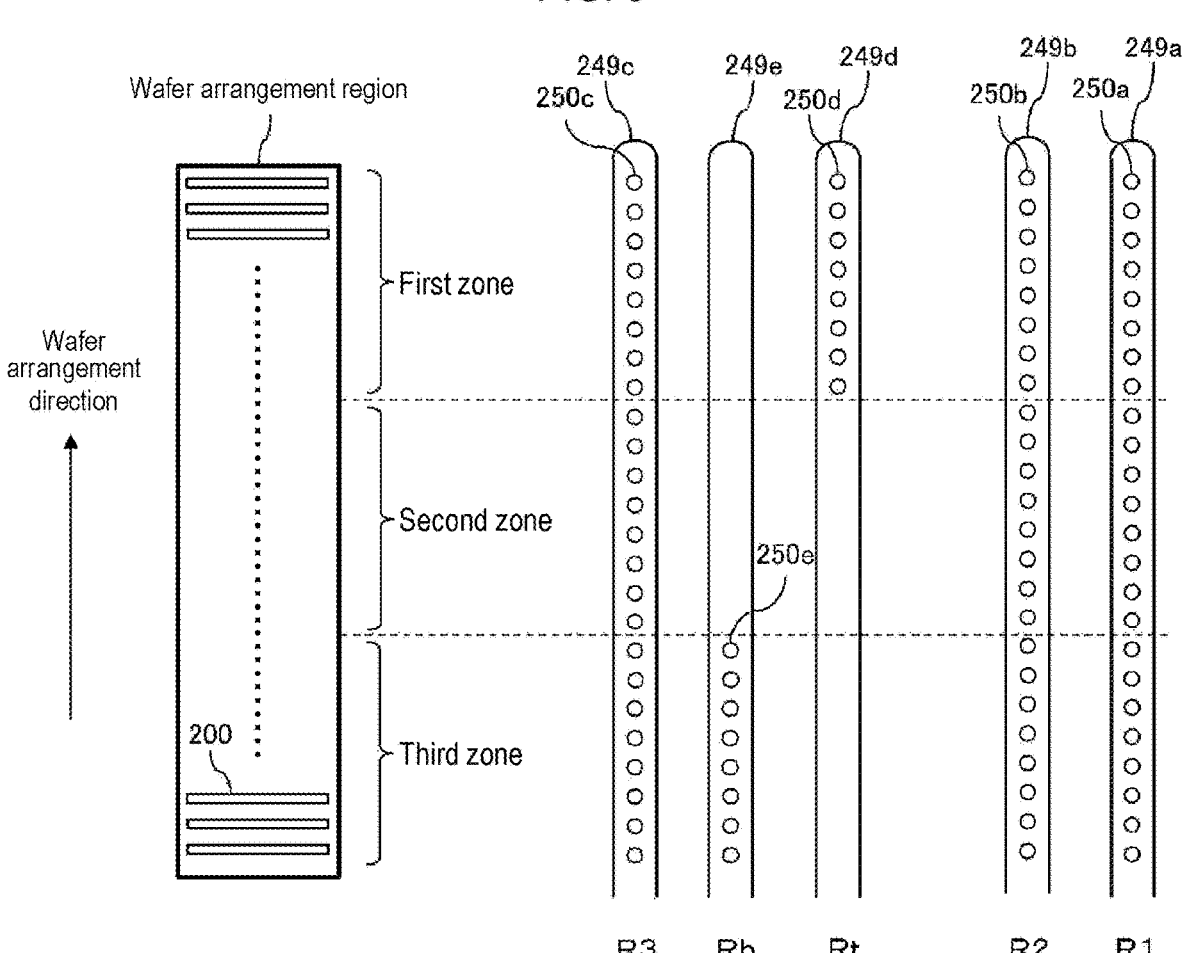
FIG. 5 is a diagram illustrating a schematic configuration diagram of a nozzle suitably used in some embodiments of the present disclosure.

As illustrated in FIG. 5, gas injection holes (gas supply holes) 250a to 250e are respectively formed on the side surfaces of the nozzles 249a to 249e. The nozzles 249a to 249e are each made of a heat resistant material, for example, quartz, SiC, and the like.

It may be considered that the wafer arrangement region described above is divided into a plurality of zones. In the embodiments, a zone on one end side (here, upper side) of the wafer arrangement region in the wafer arrangement direction will be referred to as a first zone (Top zone). In addition, a zone on the central side of the wafer arrangement region in the wafer arrangement direction will be referred to as a second zone (Center zone). Further, a zone on the other end side (here, lower side) of the wafer arrangement region in the wafer arrangement direction will be referred to as a third zone (Bottom zone).

The gas injection holes 250a to 250c in the nozzles 249a to 249c may be respectively formed in a plural number between the upper portion and the lower portion of the nozzles 249a to 249c to correspond to the entire region of the wafer arrangement region in the wafer arrangement direction. The nozzles 249a to 249c, that is, R1 to R3, are each configured to supply a gas to all the first to third zones.

The gas injection holes 250d in the nozzle 249d are formed in a plural number only on the upper side of the nozzle 249d to correspond to a region on the upper side of the wafer arrangement region in the wafer arrangement direction, that is, the first zone. The nozzle 249d, that is, Rt, is configured to supply a gas to the first zone and not to supply a gas to the other zones, that is, the second and third zones.

The gas injection holes 250e in the nozzle 249e are formed in a plural number only on the lower side of the nozzle 249e to correspond to a region on the lower side of the wafer arrangement region in the wafer arrangement direction, that is, the third zone. The nozzle 249e, that is, Rb, is configured to supply a gas to the third zone and not to supply a gas to the other zones, that is, the first and second zones.

The gas injection holes 250a to 250e are opened toward the center of the process chamber 201 to inject a gas to the center of the wafers 200. The respective gas injection holes 250a to 250e may have the same aperture area and may be formed at the same aperture pitch.

As illustrated in FIG. 2, gas supply pipes 232a to 232e are respectively connected to the nozzles 249a to 249e. Mass flow controllers (MFCs) 241a to 241e, which are flow rate controllers (flow rate control parts), and valves 243a to 243e, which are opening/closing valves, are installed at the gas supply pipes 232a to 232e sequentially from the corresponding upstream sides of gas flow, respectively. A gas supply pipe 232g is connected to the gas supply pipe 232a at the downstream side of the valve 243a. An MFC 241g and a valve 243g are respectively installed at the gas supply pipe 232g sequentially from the corresponding upstream side of gas flow. Gas supply pipes 232f and 232h are connected to the gas supply pipe 232b at the downstream side of the valve 243b. MFCs 241f and 24h and valves 243f and 243h are installed at the gas supply pipes 232f and 232h sequentially from the corresponding upstream sides of gas flow, respectively. The gas supply pipes 232a to 232h are made of, for example, a metal material such as stainless steel.

A halosilane-based gas, which contains silicon (Si) as a main element constituting a film to be formed and a halogen element, as a precursor (precursor gas), is supplied from the gas supply pipe 232a into the process chamber 201 via the MFC 241a, the valve 243a, and the nozzle 249a.

The precursor gas refers to a gaseous precursor, for example, a gas obtained by vaporizing a precursor which remains in a liquid state under a room temperature and an atmospheric pressure, or a precursor which remains in a gas state under a room temperature and an atmospheric pressure. The halosilane-based gas is a silane-based gas containing a halogen group. The halogen group contains a halogen element such as chlorine (Cl), fluorine (F), bromine (Br), and iodine (I). As the halosilane-based gas, it may be possible to use, for example, a precursor gas containing Si and Cl, that is, a chlorosilane-based gas. The chlorosilane-based gas acts as a Si source. As the chlorosilane-based gas, it may be possible to use, for example, a hexachlorodisilane ($Si_2Cl_6$, abbreviation: HCDS) gas.

An oxygen (O)—containing gas acting as an oxidizing agent (oxidizing gas), as a reactant (reaction gas) having a chemical structure (molecule structure) different from that of the precursor, is supplied from the gas supply pipe 232b into the process chamber 201 via the MFC 241b, the valve 243b, and the nozzle 249b. The O-containing gas acts as an O source. As the O-containing gas, it may be possible to use, for example, an oxygen ($O_2$) gas.

A nitrogen (N)—containing gas acting as a nitriding agent (nitriding gas), as a reactant (reaction gas) having a chemical structure (molecule structure) different from that of the precursor and the O-containing gas, is supplied from the gas supply pipe 232f into the process chamber 201 via the MFC 241f, the valve 243f, the gas supply pipe 232b, and the nozzle 249b. The N-containing gas acts as a N source. As the N-containing gas, it may be possible to use, for example, an ammonia ($NH_3$) gas which is a hydrogen nitride-based gas.

An inert gas is supplied from the gas supply pipes 232c to 232e into the process chamber 201 via the MFCs 241c to 241e, the valves 243c to 243e, and the nozzles 249c to 249e. Further, an inert gas is supplied from the gas supply pipes 232g and 232h into the process chamber 201 via the MFCs 241g and 241h, the valves 243g and 243h, the gas supply pipes 232a and 232b, and the nozzles 249a and 249b. A $N_2$ gas supplied from the nozzles 249c to 249e into the process chamber 201 mainly acts as a control gas that regulates a film thickness distribution of a film formed on the wafer 200 in the plane of the wafer 200 (hereinafter, simply referred to as an in-plane film thickness distribution). In addition, a $N_2$ gas supplied from the nozzles 249a and 249b into the process chamber 201 mainly acts as a purge gas, a carrier gas, or a dilution gas. As the inert gas, it may be possible to use, for example, a nitrogen ($N_2$) gas.

A precursor supply system mainly includes the gas supply pipe 232a, the MFC 241a, and the valve 243a. An oxidizing agent supply system as a reactant supply system mainly includes the gas supply pipe 232b, the MFC 241b, and the valve 243b. A nitriding agent supply system as a reactant supply system mainly includes the gas supply pipe 232f, the MFC 241f, and the valve 243f. An inert gas supply system mainly includes the gas supply pipes 232c to 232e, 232g and 232h, the MFCs 241c to 241e, 241g and 241h, and the valves 243c to 243e, 243g and 243h.

The nozzle 249a which supplies a precursor will be referred to as a precursor supplier. When an oxidizing agent is supplied from the nozzle 249b, the nozzle 249b will be referred to as an oxidizing agent supplier. When a nitriding agent is supplied from the nozzle 249b, the nozzle 249b will be referred to as a nitriding agent supplier. The nozzle 249b will also be referred to as a reactant supplier. The nozzles 249c to 249e which supply an inert gas will be also generally referred to as an inert gas supplier. The inert gas supplier is a supplier different from the precursor supplier, the oxidizing agent supplier, and the nitriding agent supplier. When an inert gas is supplied from the nozzles 249a and 249b, the nozzles 249a and 249b may be regarded as being included in the inert gas supplier.

One or all of various supply systems described above may be configured as an integrated supply system 248 in which the valves 243a to 243h, the MFCs 241a to 241h, and the like are integrated. The integrated supply system 248 is connected to each of the gas supply pipes 232a to 232h such that a supply operation of various kinds of gases into the gas supply pipes 232a to 232h, that is, an opening/closing operation of the valves 243a to 243h, a flow rate regulating operation by the MFCs 241a to 241h or the like, is controlled by a controller 121 to be described below. The integrated supply system 248 is configured as an integral type or division type integrated unit, and is configured such that the integrated supply system is detachable from the gas supply pipes 232a to 232h or the like on an integrated unit basis, whereby it is possible to perform maintenance, replacement, expansion or the like of the integrated supply system 248, on the integrated unit basis.

An exhaust port (exhaust slit) 204c configured as, for example, a slit-like through-hole, is vertically elongated on a side surface of the inner tube 204. The exhaust port 204c has, for example, a rectangular shape in front view, and is installed to correspond to the entire region of the wafer arrangement region in the wafer arrangement direction between the lower portion and the upper portion of the sidewall of the inner tube 204. The interior of the process chamber 201 and an exhaust space 205 as an annular space between the inner tube 204 and the outer tube 203 are in fluid communication with each other via the exhaust port 204c. The nozzle accommodating chamber 204a and the exhaust port 204c are configured to face each other in the plane view, with the centers of the wafers 200 accommodated in the process chamber 201 interposed therebetween. Further, the gas injection holes 250a of the nozzle 249a and the exhaust port 204c are configured to face each other with the centers of the wafers 200 accommodated in the process chamber 201 interposed therebetween.

As illustrated in FIG. 2, in the present disclosure, a line segment connecting the gas injection holes 250a of the nozzle 249a accommodated in the nozzle accommodating chamber 204a and the exhaust port 204c will be referred to as a straight line L1. The straight line L1 is bisected at the center position of the wafers 200 accommodated in the process chamber 201. The straight line L1 and a straight line D which is a bisector perpendicular to the straight line L1 have a relationship in which the straight line L1 and the straight line D are orthogonal to each other at the center position of the wafers 200 accommodated in the process chamber 201.

The nozzle accommodating chamber 204b is installed at a region in the process chamber 201 on the exhaust port 204c side and partitioned by the straight line D described above in the plane view. That is, the nozzles 249c to 249e are all installed at a region in the process chamber 201 on the exhaust port 204c side and partitioned by the straight line D described above in the plane view. A position where all the nozzles 249c to 249e are disposed is closer to the exhaust port 204c than a position where the nozzle 249a is disposed. Distances between the nozzles 249c to 249e and the exhaust port 204c are all set shorter than a distance between the nozzle 249a and the exhaust port 204c.

In addition, in the embodiments, the nozzle 249b is installed adjacent to the nozzle 249a, that is, at a substantially opposite position of the exhaust port 204c, with the wafers 200 accommodated in the process chamber 201 interposed therebetween. Therefore, the position where all the nozzles 249c to 249e are disposed is closer to the exhaust port 204c than the position where the nozzles 249b is disposed. Distances between the nozzles 249c-249e and the exhaust port 204c are all set shorter than a distance between the nozzles 249b and the exhaust port 204c. Furthermore, the position where all the nozzles 249c to 249e are installed is farther from the nozzle 249a than the position where the nozzle 249b is installed. Distances between the nozzles 249c to 249e and the nozzles 249a are all set longer than a distance between the nozzle 249b and the nozzle 249a.

As illustrated in FIG. 2, in the present disclosure, a straight line passing through the centers of the wafers 200 accommodated in the process chamber 201 and the center of the nozzle 249c accommodated in the nozzle accommodating chamber 204b will be referred to as a straight line L2. A central angle θ (a central angle with respect to an arc having the centers of the nozzles 249a and 249c as both ends) formed by the straight line L1 and the straight line L2 described above is set at an angle which falls within a range of, for example, 100 to 170 degrees.

As illustrated in FIG. 1, an exhaust pipe 231 configured to exhaust an internal atmosphere of the process chamber 201 is connected to a lower portion of the outer tube 203 via the exhaust space 205. A vacuum pump 246 as a vacuum exhaust device is connected to the exhaust pipe 231 via a pressure sensor 245 as a pressure detector (pressure detection part) which detects the internal pressure of the exhaust space 205, that is, the internal pressure of the process chamber 201, and an auto pressure controller (APC) valve 244 as a pressure regulator (pressure regulation part). The APC valve 244 is configured so that a vacuum exhaust and a vacuum exhaust stop of the interior of the process chamber 201 may be performed by opening and closing the APC valve 244 while operating the vacuum pump 246 and so that the internal pressure of the process chamber 201 may be regulated by adjusting an opening degree of the APC valve 244 based on pressure information detected by the pressure sensor 245 while operating the vacuum pump 246. An exhaust system mainly includes the exhaust pipe 231, the APC valve 244 and the pressure sensor 245. The exhaust port 204c, the exhaust space 205 and the vacuum pump 246 may be regarded as being included in the exhaust system.

A lower end opening of the manifold 209 is hermetically sealed by the seal cap 219 via the O-ring 220b. The seal cap 219 is made of a metal material such as SUS, and is formed in a disc shape. A rotation mechanism 267 configured to rotate the boat 217 is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up or down by the boat elevator 115 which is an elevator mechanism vertically installed outside the reaction tube 210. The boat elevator 115 is configured as a transfer device (transfer mechanism) which loads and unloads (transfers) the wafers 200 supported by the boat 217 into and from (out of) the process chamber 201 by moving the seal cap 219 up or down.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is installed between the outer tuber 203 and the inner tube 204. Based on temperature information detected by the temperature sensor 263, a degree of supplying electric power to the heater 207 is regulated such that the interior of the process chamber 201 has a desired temperature distribution. The temperature sensor 263 is installed along the inner wall of the outer tube 203.

Figure 3:
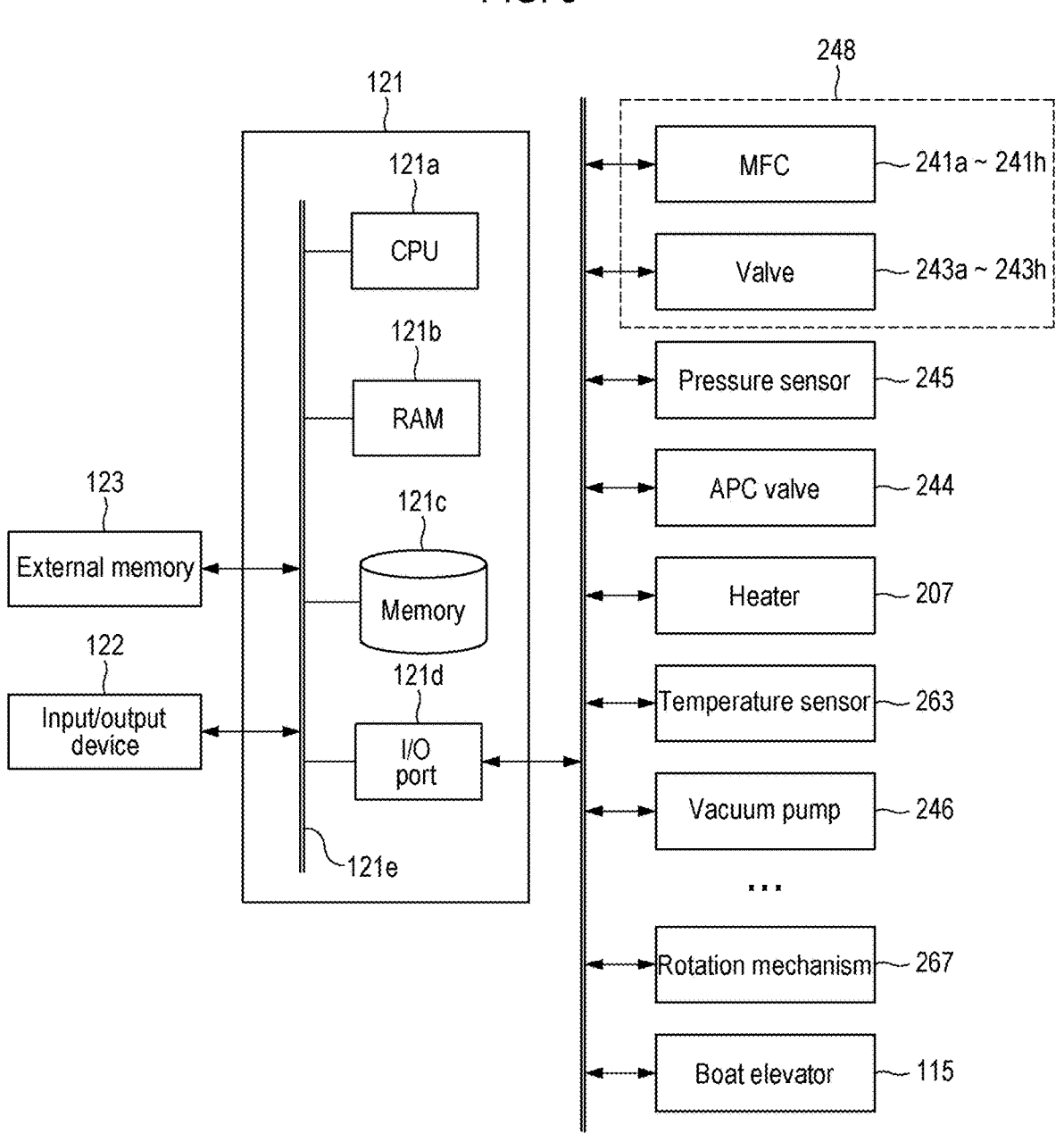
FIG. 3 is a schematic configuration diagram of a controller of a substrate processing apparatus suitably used in some embodiments of the present disclosure, in which a control system of the controller is shown in a block diagram.

As illustrated in FIG. 3, the controller 121, which is a control part (control means), may be configured as a computer including a central processing unit (CPU) 121a, a random access memory (RAM) 121b, a memory 121c, and an I/O port 121d. The RAM 121b, the memory 121c, and the I/O port 121d are configured to exchange data with the CPU 121a via an internal bus 121e. An input/output device 122 formed of, for example, a touch panel or the like, is connected to the controller 121.

The memory 121c includes, for example, a flash memory, a hard disk drive (HDD), or the like. A control program that controls operations of a substrate processing apparatus, a process recipe in which sequences and conditions of substrate processing as described below are specified, or the like is readably stored in the memory 121c. The process recipe functions as a program that causes the controller 121 to execute each sequence in the substrate processing, as described below, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program, data or the like read by the CPU 121a is temporarily stored.

The I/O port 121d is connected to the MFCs 241a to 241h, the valves 243a to 243h, the pressure sensor 245, the APC valve 244, the vacuum pump 246, the heater 207, the temperature sensor 263, the rotation mechanism 267, the boat elevator 115, and the like described above.

The CPU 121a is configured to read the control program from the memory 121c and execute the same. The CPU 121a also reads the recipe from the memory 121c according to an input of an operation command from the input/output device 122, and the like. In addition, the CPU 121a is configured to control, according to the contents of the recipe thus read, the flow rate regulating operation of various kinds of gases by the MFCs 241a to 241h, the opening/closing operation of the valves 243a to 243h, the opening/closing operation of the APC valve 244, the pressure regulating operation performed by the APC valve 244 based on the pressure sensor 245, the driving and stopping of the vacuum pump 246, the temperature regulating operation performed by the heater 207 based on the temperature sensor 263, the operation of rotating the boat 217 with the rotation mechanism 267 and adjusting the rotation speed of the boat 217, the operation of moving the boat 217 up or down with the boat elevator 115, and the like.

The controller 121 may be configured by installing, on the computer, the aforementioned program stored in an external memory 123. The external memory 123 may include, for example, a magnetic disc such as a HDD, an optical disc such as a CD, a magneto-optical disc such as a MO, a semiconductor memory such as a USB memory, and the like. The memory 121*c* or the external memory 123 is configured as a computer-readable recording medium. Hereinafter, the memory 121*c* and the external memory 123 will be generally and simply referred to as a "recording medium." When the term "recording medium" is used herein, it may indicate a case of including only the memory 121*c*, a case of including only the external memory 123, or a case of including both the memory 121*c* and the external memory 123. Furthermore, the program may be supplied to the computer by using a communication means such as the Internet or a dedicated line, instead of using the external memory 123.

(2) Substrate Processing

A substrate processing sequence example of forming a film on a wafer 200 as a substrate by using the aforementioned substrate processing apparatus, that is, a film-forming sequence example, which is a process of manufacturing a semiconductor device, will be described with reference to FIG. 4. In the following descriptions, the operations of the respective parts constituting the substrate processing apparatus are controlled by the controller 121.

Figure 4:
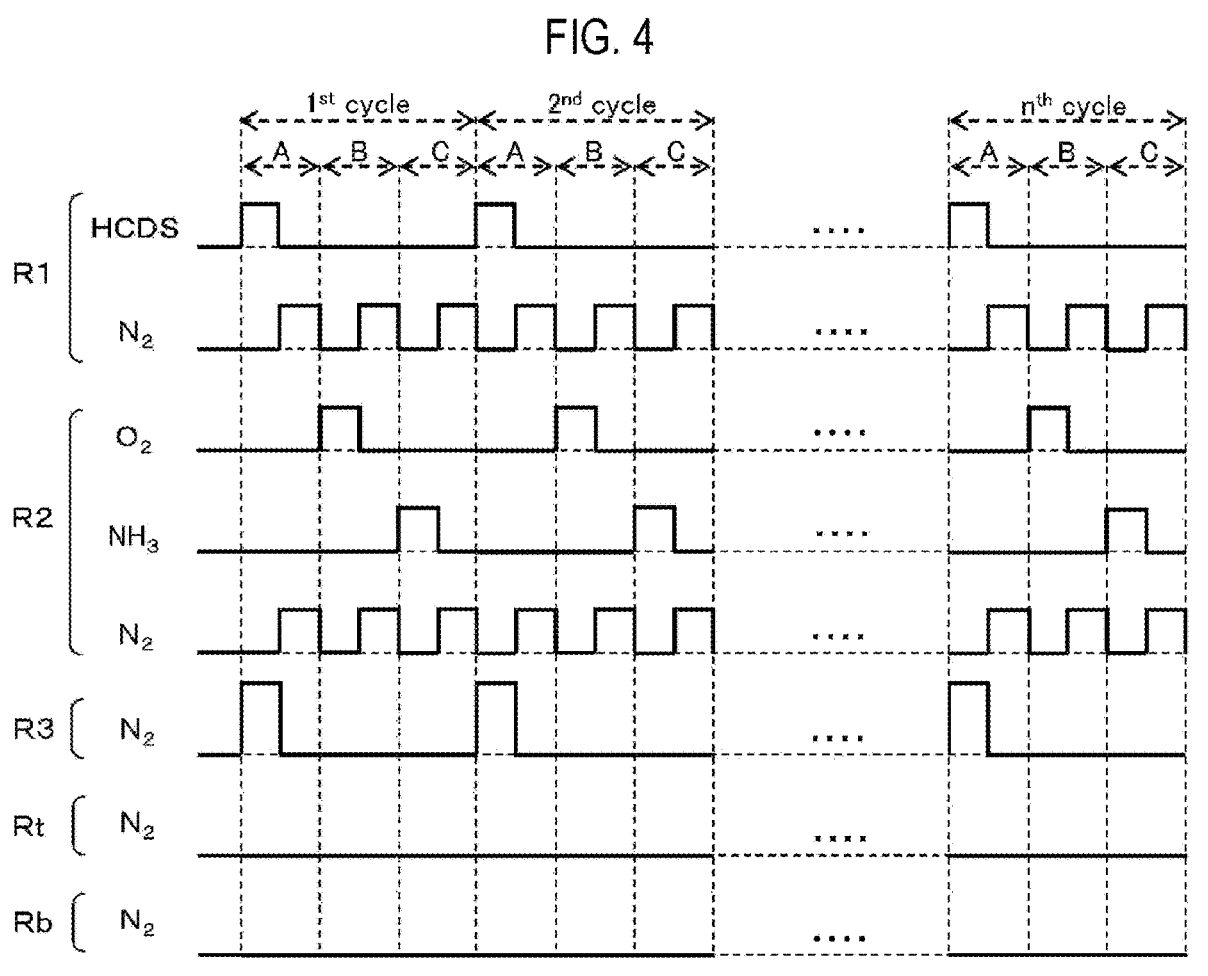

In the film-forming sequence illustrated in FIG. 4, a film containing Si, O, and N, that is, a silicon oxynitride film (SiON film), is formed as a film on a wafer 200 by performing a cycle a predetermined number of times (n times, where n is an integer of 1 or more), the cycle including non-simultaneously performing: step A of supplying a HCDS gas as a precursor from the nozzle 249*a* as the first supplier to the wafer 200 in the process chamber 201 and exhausting the HCDS gas from the exhaust port 204*c* installed opposite to the nozzle 249*a* with the wafer 200 interposed therebetween; step B of supplying an $O_2$ gas, which is an oxidizing agent, as a reactant, from the nozzle 249*b* as the second supplier to the wafer 200 in the process chamber 201 and exhausting the $O_2$ gas from the exhaust port 204*c*; and step C of supplying a $NH_3$ gas, which is a nitriding agent, as the reactant, from the nozzle 249*b* as the second supplier to the wafer 200 in the process chamber 201 and exhausting the $NH_3$ gas from the exhaust port 204*c*.

Further, at step A described above, an in-plane film thickness distribution of the SiON film formed on the wafer 200 is regulated by supplying, into the process chamber 201, a $N_2$ gas as an inert gas from the nozzle 249*c* as the third supplier installed at a region, which is a region on a side of the exhaust port 204*c* among a plurality of regions partitioned in the process chamber 201 by a bisector D perpendicular to a straight line (line segment) L1 connecting the nozzle 249*a* and the exhaust port 204*c* in the plane view.

In the present disclosure, for the sake of convenience, the film-forming sequence illustrated in FIG. 4 may sometimes be denoted as follows. In FIG. 4, execution periods of steps A to C are denoted as A to C for the sake of convenience, respectively. The same denotation will be used in the modifications and other embodiments to be described below.

$$(R1: HCDS+R3: N_2\rightarrow R2: O_2\rightarrow R2: NH_3)\times n\Rightarrow SiON$$

When the term "wafer" is used herein, it may refer to a wafer itself or a laminated body of a wafer and a predetermined layer or film formed on the surface of the wafer. In addition, when the phrase "a surface of a wafer" is used herein, it may refer to a surface of a wafer itself or a surface of a predetermined layer or the like formed on a wafer. Further, in the present disclosure, the expression "a predetermined layer is formed on a wafer" may mean that a predetermined layer is directly formed on a surface of a wafer itself or that a predetermined layer is formed on a layer or the like formed on a wafer. In addition, when the term "substrate" is used herein, it may be synonymous with the term "wafer."

Wafer Charging and Boat Loading

A plurality of wafers 200 is charged on the boat 217 (wafer charging). Thereafter, as illustrated in FIG. 1, the boat 217 supporting the plurality of wafers 200 is lifted up by the boat elevator 115 and is loaded into the process chamber 201 (boat loading). In this state, the plurality of wafers 200 is arranged in the process chamber 201, and the seal cap 219 seals the lower end of the manifold 209 via the O-ring 220*b*.

Pressure Regulation and Temperature Regulation

The interior of the process chamber 201, namely the space in which the wafers 200 are located, is vacuum-exhausted (depressurization-exhausted) by the vacuum pump 246 to reach a desired pressure (degree of vacuum). In this operation, the internal pressure of the process chamber 201 is measured by the pressure sensor 245. The APC valve 244 is feedback-controlled based on the measured pressure information. Furthermore, the wafers 200 in the process chamber 201 are heated by the heater 207 to a desired temperature. In this operation, the degree of supplying electric power to the heater 207 is feedback-controlled based on the temperature information detected by the temperature sensor 263 such that the interior of the process chamber 201 has a desired temperature distribution. In addition, the rotation of the wafers 200 by the rotation mechanism 267 begins. As illustrated in FIG. 2, the rotation direction of the wafers 200 is such that the position of the nozzle 249*c* is located on the upper stream side of the wafers 200 in the rotation direction rather than the position of the exhaust port 204*c*, when viewed with reference to a counterclockwise direction in the plane view, that is, the rotation direction of the wafers 200. The exhaust of the interior of the process chamber 201 and the heating and rotation of the wafers 200 may be all continuously performed at least until the processing of the wafers 200 is completed.

Film-Forming Step

Next, the following steps A to C are sequentially performed.

Step A

At this step, a HCDS gas is supplied to the wafer 200 in the process chamber 201 (HCDS gas supple step).

Specifically, the valve 243*a* is opened to allow the HCDS gas to flow through the gas supply pipe 232*a*. A flow rate of the HCDS gas is regulated by the MFC 241a. The HCDS gas is supplied from each of the plurality of gas injection holes 250a formed on the side surface of the nozzle 249a into the process chamber 201 and is exhausted from the exhaust pipe 231 via the exhaust port 204c and the exhaust space 205. At this time, the HCDS gas is supplied to the wafer 200 from the side of the wafer 200.

At this time, the valve 243c is opened to supply a $N_2$ gas from the nozzle 249c into the process chamber 201. A flow rate of the $N_2$ gas is regulated by the MFC 241c. The $N_2$ gas is supplied from each of the plurality of gas injection holes 250c installed at the side surface of the nozzle 249c into the process chamber 201 and is exhausted from the exhaust pipe 231 via the exhaust port 204c and the exhaust space 205. At this time, the $N_2$ gas is supplied to the wafer 200 from the side of the wafer 200. By doing so and by regulating the flow rate of the $N_2$ gas at this time, it is possible to regulate the in-plane film thickness distribution of the SiON film formed on the wafer 200. Specific contents and operational effects of such a control will be described below.

At this time, the valves 243g, 243h, 243d and 243e may be opened to supply the $N_2$ gas from the nozzles 249a, 249b, 249d and 249e into the process chamber 201.

Processing conditions at this step may be exemplified as follows:

HCDS gas supply flow rate: 0.01 to 2 slm, specifically 0.1 to 1 slm in some embodiments $N_2$ gas supply flow rate (R3): 0.1 to 20 slm $N_2$ gas supply flow rate (per each of R1, R2, Rt, and Rb): 0 to 10 slm Supply time of each gas: 1 to 120 seconds, specifically 1 to 60 seconds in some embodiments Processing temperature: 250 to 800 degrees C., specifically 400 to 700 degrees C. in some embodiments Processing pressure: 1 to 2,666 Pa, specifically 67 to 1,333 Pa in some embodiments.

In the present disclosure, an expression of a numerical range such as "250 to 800 degrees C." may mean that a lower limit value and an upper limit value are included in that range. Therefore, for example, "250 to 800 degrees C." may mean "250 degrees C. or higher and 800 degrees C. or lower." The same applies to other numerical ranges.

By supplying the HCDS gas to the wafer 200 under the aforementioned conditions, a Si-containing layer containing Cl is formed as a first layer on the outermost surface of the wafer 200. The Si-containing layer containing Cl is formed on the outermost surface of the wafer 200 by physisorption of HCDS, chemisorption of a substance (hereinafter, referred to as $Si_xCl_y$) in which HCDS is partially decomposed, deposition of Si by pyrolysis of HCDS, or the like. The Si-containing layer containing Cl may be an adsorption layer (a physisorption layer or a chemisorption layer) of HCDS or $Si_xCl_y$, or may be a Si layer (a deposition layer of Si) containing Cl. In the present disclosure, the Si-containing layer containing Cl will be simply referred to as a Si-containing layer.

After the first layer is formed, the valve 243a is closed to stop the supply of the HCDS gas into the process chamber 201. Then, the interior of the process chamber 201 is vacuum-exhausted and the gas or the like remaining within the process chamber 201 is removed from the interior of the process chamber 201 (purge step). At this time, the valves 243c to 243e, 243g and 243h may be opened to supply the $N_2$ gas from the nozzles 249a to 249e into the process chamber 201. In FIG. 4, an example of supplying the $N_2$ gas is supplied from the nozzles 249a and 249b is illustrated. The $N_2$ gas acts as a purge gas.

As the precursor (precursor gas), it may be possible to use, in addition to the HCDS gas, a chlorosilane-based gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, and an octachlorotrisilane ($Si_3Cl_8$, abbreviation: OCTS) gas.

As the inert gas, it may be possible to use, in addition to the $N_2$ gas, a rare gas such as an Ar gas, a He gas, a Ne gas, and a Xe gas. This also applies to each step as described below.

Step B

After step A is completed, an $O_2$ gas is supplied to the wafer 200 in the process chamber 201, that is the first layer formed on the wafer 200 ($O_2$ gas supply step).

Specifically, the valve 243b is opened to allow an $O_2$ gas to flow through the gas supply pipe 232b. A flow rate of the $O_2$ gas is regulated by the MFC 241b. The $O_2$ gas is supplied from each of the plurality of gas injection holes 250b installed at the side surface of the nozzle 249b into the process chamber 201 and is exhausted from the exhaust port 231 via the exhaust port 204c and the exhaust space 205. At this time, the $O_2$ gas is supplied to the wafer 200 from the side of the wafer 200. Simultaneously, the $N_2$ gas may be supplied from the nozzles 249a to 249e into the process chamber 201.

Processing conditions at this step may be exemplified as follows:

$O_2$ gas supply flow rate: 0.1 to 10 slm $N_2$ gas supply flow rate (per each of R1, R2, R3, Rt, and Rb): 0 to 10 slm Supply time of each gas: 1 to 120 seconds, specifically 1 to 60 seconds in some embodiments Processing pressure: 1 to 4,000 Pa, specifically 1 to 3,000 Pa in some embodiments.

Other processing conditions may be similar to the processing conditions of step A.

By supplying the $O_2$ gas to the wafer 200 under the aforementioned conditions, at least a portion of the first layer formed on the wafer 200 is oxidized (modified). By modifying the first layer, a layer containing Si and O, that is, a SiO layer, is formed as a second layer on the wafer 200. When forming the second layer, an impurity such as Cl contained in the first layer constitutes a gaseous substance containing at least Cl in the process of modifying the first layer with the $O_2$ gas, and is discharged from the interior of the process chamber 201. Thus, the second layer becomes a layer containing a smaller amount of impurity such as Cl than that of the first layer.

After the second layer is formed, the valve 243b is closed to stop the supply of the $O_2$ gas into the process chamber 201. Then, the gas or the like remaining within the process chamber 201 is removed from the interior of the process chamber 201 according to the same processing procedures as those of the purge step of step A (purge step).

As the oxidizing agent (oxidizing gas), it may be possible to use, in addition to the $O_2$ gas, an O-containing gas such as a nitrous oxide ($N_2O$) gas, a nitric oxide (NO) gas, a nitrogen dioxide ($NO_2$) gas, an ozone ($O_3$) gas, water vapor ($H_2O$ gas), a carbon monoxide (CO) gas, and a carbon dioxide ($CO_2$) gas.

Step C

After step B is completed, a $NH_3$ gas is supplied to the wafer 200 in the process chamber 201, that is the second layer formed on the wafer 200 ($NH_3$ gas supply step).

Specifically, the valve 243f is opened to allow a NH₃ gas to flow through the gas supply pipe 232f. A flow rate of the NH₃ gas is regulated by the MFC 241f. The NH₃ gas is allowed to flow through the nozzle 249b via the gas supply pipe 232b, is supplied from each of the plurality of gas injection holes 250b formed on the side surface of the nozzle 249b into the process chamber 201, and is exhausted from the exhaust pipe 231 via the exhaust port 204c and the exhaust space 205. At this time, the NH₃ gas is supplied to the wafer 200 from the side of the wafer 200. At this time, the N₂ gas may be supplied from the nozzles 249a to 249e into the process chamber 201.

Processing conditions at this step may be exemplified as follows:

NH₃ gas supply flow rate: 0.1 to 10 slm

N₂ gas supply flow rate (per each of R1, R2, R3, Rt, and Rb): 0 to 10 slm

Supply time of each gas: 1 to 120 seconds, specifically 1 to 60 seconds in some embodiments Processing pressure: 1 to 4,000 Pa, specifically 1 to 3,000 Pa in some embodiments.

Other processing conditions may be similar to the processing conditions of step A.

By supplying the NH₃ gas to the wafer 200 under the aforementioned conditions, at least a portion of the second layer formed on the wafer 200 is nitrided (modified). By modifying the second layer, a layer containing Si, O, and N, that is, a SiON layer, is formed as a third layer on the wafer 200. When forming the third layer, an impurity such as Cl contained in the second layer constitutes a gaseous substance containing at least Cl in the process of modifying the second layer with the NH₃ gas, and is discharged from the interior of the process chamber 201. Thus, the third layer becomes a layer containing a smaller amount of impurity such as Cl than that of the second layer.

After the third layer is formed, the valve 243f is closed to stop the supply of the NH₃ gas into the process chamber 201. Then, the gas or the like remaining within the process chamber 201 is removed from the interior of the process chamber 201 according to the same processing procedures as those of the purge step of step A (purge step).

As the nitriding agent (nitriding gas), it may be possible to use, in addition to the NH₃ gas, a N-containing gas such as a diazene (N₂H₂) gas, a hydrazine (N₂H₄) gas, and a N₃H₈ gas.

Performing a Predetermined Number of Times

A cycle which non-simultaneously, that is, non-synchronously, performs steps A to C is implemented one or more times (n times), whereby a SiON film having a desired thickness and a desired composition can be formed on the wafer 200. The aforementioned cycle may be performed multiple times. That is, the thickness of the third layer formed per one cycle may be set smaller than the desired thickness, and the aforementioned cycle may be performed multiple times until the thickness of the SiON film formed by laminating the third layer becomes equal to the desired thickness.

After-Purge and Atmospheric Pressure Return

After the film-forming step is completed, the N₂ gas is supplied from the nozzles 249a to 249e into the process chamber 201 and is exhausted from the exhaust pipe 231 via the exhaust port 204c and the exhaust space 205. The N₂ gas acts as a purge gas. Thus, the interior of the process chamber 201 is purged and the gas or the reaction byproduct, which remains within the process chamber 201, is removed from the interior of the process chamber 201 (after-purge). Thereafter, the internal atmosphere of the process chamber 201 is substituted by an inert gas (inert gas substitution). The internal pressure of the process chamber 201 is returned to an atmospheric pressure (atmospheric pressure return).

Boat Unloading and Wafer Discharging

The seal cap 219 is moved down by the boat elevator 115 to open the lower end of the manifold 209. Then, the processed wafers 200 supported on the boat 217 are unloaded from the lower end of the manifold 209 to the outside of the reaction tube 210 (boat unloading). The processed wafers 200 are unloaded to the outside of the reaction tube 210 and are subsequently discharged from the boat 217 (wafer discharging).

(3) Supply Control of N₂ Gas and Operational Effects

Next, specific contents of the supply control of the N₂ gas performed at step A and operational effects thereof will be described.

(a) When the supply of the HCDS gas to the wafer 200 is performed from the side of the wafer 200 as in the embodiments, there is a tendency that the formation of the first layer on the wafer 200 starts in advance in the outer peripheral portion of the wafer 200 and the start is delayed at the center of the wafer 200. As a result, the in-plane film thickness distribution of the SiON film formed on the wafer 200 have a tendency in which the thickness is the smallest at the center of the surface of the wafer 200 and gradually increases as it approaches the outer peripheral portion (central-recessed distribution).

With regard to this tendency, in the embodiments, it is possible to extensively regulate the in-plane film thickness distribution of the SiON film formed on the wafer 200 by supplying the N₂ gas from a nozzle 249c at the HCDS gas supply step. For example, the in-plane film thickness distribution of the SiON film formed on the wafer 200 may be brought closer to a distribution (flat distribution) in which the thickness becomes equal at the center and the outer peripheral portion of the surface of the wafer 200 from the central-recessed distribution or closer to a distribution (central convex distribution) in which the thickness is the largest at the center of the surface of the wafer 200 and decreases gradually as it approaches the outer peripheral portion of the surface of the wafer 200.

This is because the nozzle 249c configured to supply the N₂ gas to the wafer 200 at the HCDS gas supply step is disposed at a region, which is a region on a side of the exhaust port 204c among a plurality of regions partitioned in the process chamber 201 by the bisector D perpendicular to the straight line L1 connecting the nozzle 249a and the exhaust port 204c in the plane view. That is, this is because the supply of the N₂ gas to the wafer 200 at the HCDS gas supply step is performed by using the nozzle 249c disposed at a position near the exhaust port 204c. According to the embodiments, it is possible to appropriately suppress the N₂ gas injected from the gas injection holes 250c from arriving at the center of the wafer 200. Further, it is possible to efficiently supply the N₂ gas injected from the gas injection holes 250c to the outer peripheral portion of the wafer 200. As a result, it is possible to locally (selectively) reduce a partial pressure (concentration) of the HCDS gas in the outer peripheral portion of the wafer 200 while suppressing reduction of the partial pressure (concentration) of the HCDS gas at the center of the wafer 200. This makes it possible to appropriately suppress the formation of the first layer in the outer peripheral portion of the wafer 200 without hindering the formation of the first layer at the center of the wafer 200. As a result, it is possible to extensively regulate the in-plane film thickness distribution of the SiON film formed on the wafer 200 as described above.

(b) As a position where the nozzle 249c is disposed is closer to the exhaust port 204c than a position where the nozzle 249a is disposed, that is, the distance between the nozzle 249c and the exhaust port 204c is set to be shorter than the distance between the nozzle 249a and the exhaust port 204c, it is possible to more reliably perform the aforementioned regulation of the in-plane film thickness distribution of the SiON film formed on the wafer 200.

(c) As a position where the nozzle 249c is disposed is closer to the exhaust port 204c than a position where the nozzle 249b is disposed, that is, the distance between the nozzle 249c and the exhaust port 204c is set to be shorter than the distance between the nozzle 249b and the exhaust port 204c, it is possible to more reliably perform the aforementioned regulation of the in-plane film thickness distribution of the SiON film formed on the wafer 200.

(d) As a position where the nozzle 249c is installed is farther from the nozzle 249a than a position where the nozzle 249b is installed, that is, the distance between the nozzle 249c and the nozzle 249a is set to be longer than the distance between the nozzle 249b and the nozzle 249a, it is possible to more reliably perform the aforementioned regulation of the in-plane film thickness distribution of the SiON film formed on the wafer 200.

(e) By controlling the flow rate of the $N_2$ gas supplied from the nozzle 249c at the HCDS gas supply step, it is possible to more reliably perform the aforementioned regulation of the in-plane film thickness distribution of the SiON film formed on the wafer 200.

For example, the flow rate of the $N_2$ gas supplied from the nozzle 249c is set larger than the flow rate of the HCDS gas supplied from the nozzle 249a at the HCDS gas supply step. By doing so, it is possible to control so that the aforementioned effects on the in-plane film thickness distribution of the SiON film formed on the wafer 200 are enhanced.

Further, for example, the flow rate of the $N_2$ gas supplied from the nozzle 249c is set equal to or less than the flow rate of the HCDS gas supplied from the nozzle 249a at the HCDS gas supply step. By doing so, it is possible to control the aforementioned effect on the in-plane film thickness distribution of the SiON film formed on the wafer 200 in a direction of weakening.

In addition, for example, when the $N_2$ gas is supplied from the nozzle 249c at the $O_2$ gas supply step or the $NH_3$ gas supply step, the flow rate of the $N_2$ gas supplied from the nozzle 249c at the HCDS gas supply step is set larger than the flow rate of the $N_2$ gas supplied from the nozzle 249c at the $O_2$ gas supply step or the $NH_3$ gas supply step. By doing so, it is possible to control so that the aforementioned effects on the in-plane film thickness distribution of the SiON film formed on the wafer 200 are enhanced.

Moreover, for example, when the $N_2$ gas is supplied from the nozzle 249c at the $O_2$ gas supply step or the $NH_3$ gas supply step, the flow rate of the $N_2$ gas supplied from the nozzle 249c at the HCDS gas supply step is set equal to or less than the flow rate of the $N_2$ gas supplied from the nozzle 249c at the $O_2$ gas supply step or the $NH_3$ gas supply step. By doing so, it is possible to control so that the aforementioned effects on the in-plane film thickness distribution of the SiON film formed on the wafer 200 are weakened.

Further, for example, when the $N_2$ gas is supplied from the nozzle 249a at the HCDS gas supply step, the flow rate of the $N_2$ gas supplied from the nozzle 249c is set larger than the flow rate of the $N_2$ gas supplied from the nozzle 249a. By doing so, it is possible to control so that the aforementioned effects on the in-plane film thickness distribution of the SiON film formed on the wafer 200 are enhanced.

In addition, for example, when the $N_2$ gas is supplied from the nozzle 249a at the HCDS gas supply step, the flow rate of the $N_2$ gas supplied from the nozzle 249c is set larger than the total flow rate of the HCDS gas and the $N_2$ gas supplied from the nozzle 249a. By doing so, it is possible to control so that the aforementioned effects on the in-plane film thickness distribution of the SiON film formed on the wafer 200 are enhanced.

Further, for example, when the $N_2$ gas is supplied from the nozzle 249b at the HCDS gas supply step, the flow rate of the $N_2$ gas supplied from the nozzle 249c is set larger than the flow rate of the $N_2$ gas supplied from a nozzle 249b. By doing so, it is possible to control so that the aforementioned effects on the in-plane film thickness distribution of the SiON film formed on the wafer 200 are enhanced.

(f) As described above, when the supply of the HCDS gas to the wafer 200 is performed from the side of the wafer 200, the in-plane film thickness distribution of the SiON film formed on the wafer 200 tends to become the central-recessed distribution. This phenomenon becomes more remarkable when a pattern including a recess such as a trench or a hole is formed on the surface of the wafer 200. Therefore, the embodiments producing the aforementioned effects are more effective when a film is formed on a wafer 200 in which a pattern including a recess is formed on its surface.

(g) By disposing the nozzle 249c at the upper stream side than the position of the exhaust port 204c in the rotation direction of the wafer 200 when viewed with reference to the rotation direction of the wafer 200, as illustrated in FIG. 2, it is possible to locally (selectively) reduce the partial pressure (concentration) of the HCDS gas at the outer peripheral portion of the wafer 200 with excellent controllability while suppressing the reduction of the partial pressure (concentration) of the HCDS gas at the center of the wafer 200. As a result, it is possible to easily and extensively regulate the in-plane film thickness distribution of the SiON film formed on the wafer 200 as described above.

(h) The effects mentioned above may be similarly achieved in the case where the aforementioned precursor other than the HCDS gas are used, in the case where the aforementioned oxidizing agent other than the $O_2$ gas is used, in the case where the aforementioned nitriding agent other than the $NH_3$ gas is used, or in the case where the aforementioned inert gas other than the $N_2$ gas is used.

(4) Exemplary Modifications

The film-forming step according to the present disclosure is not limited to the aforementioned embodiments but may be modified as in the modifications described below. These modifications may be arbitrarily combined. Unless otherwise stated, processing procedures and processing conditions of each step of each modification may be similar to the processing procedures and the processing conditions of each step of the substrate processing sequence described above.

Modification 1

At the HCDS gas supply step, at least one selected from the group of the valves 243d and 243e, in addition to the valve 243c, may be opened to supply a $N_2$ gas from at least one selected from the group of the nozzles 249d and 249e, in addition to the nozzle 249c, into the process chamber 201. The gas $N_2$ injected from the nozzles 249d and 249e is supplied to the wafer 200 from the side of the wafer 200. The flow rate of the $N_2$ gas supplied from nozzles 249d and 249e may be set to fall within a range of, for example, 0.1 to 20 slm.

Even in the modification, the same effects as those of the aforementioned substrate processing sequence illustrated in FIG. 4 may be achieved. Further, according to the modification, it is possible to finely regulate the in-plane film thickness distribution of the SiON film formed on the wafer 200 among the wafers.

Figure 7:
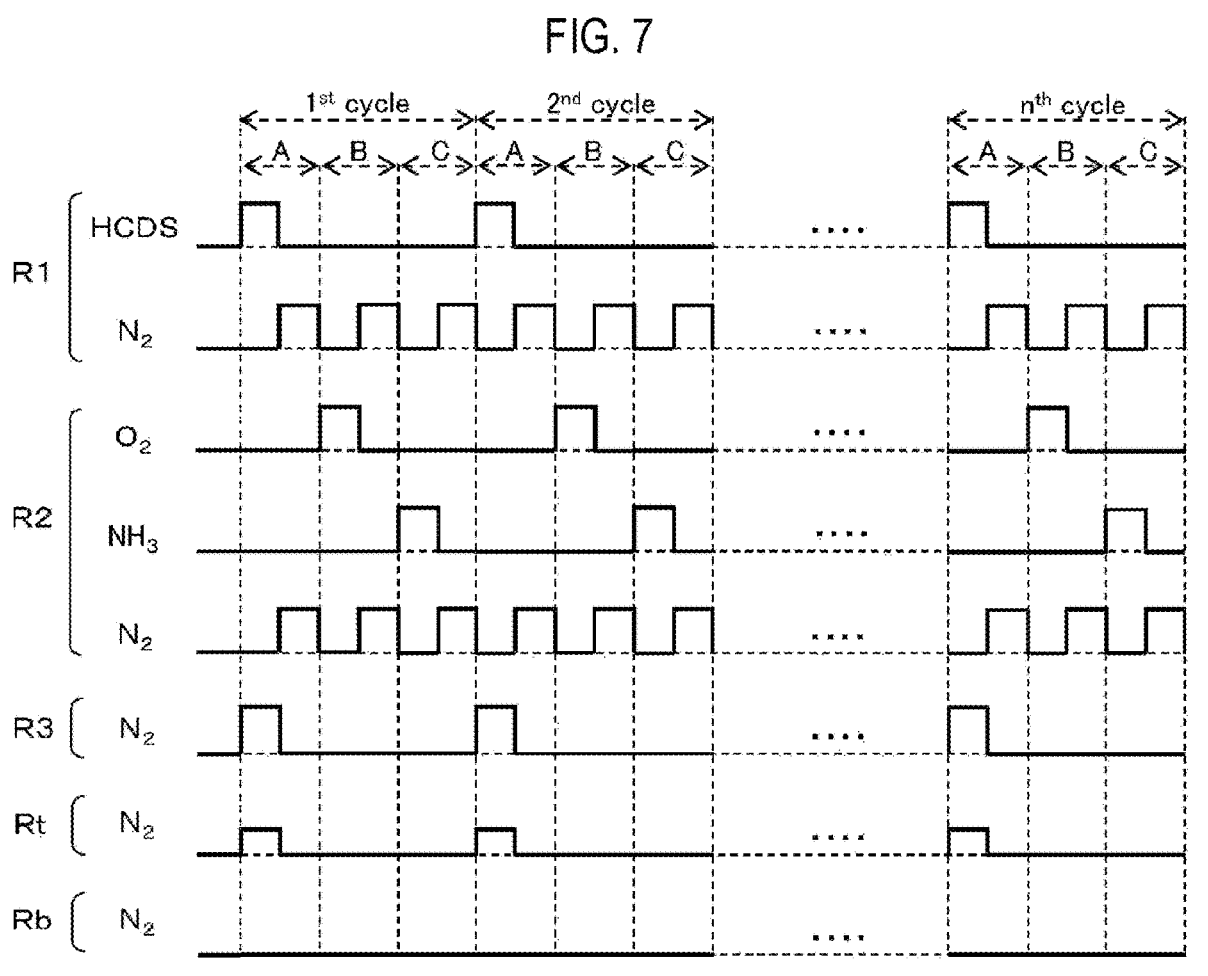

For example, by supplying the $N_2$ gas from the nozzle 249d, in addition to the nozzle 249c, at the HCDS gas supply step as in the film-forming sequence in FIG. 7 or illustrated below, it is possible to selectively enhance the aforementioned effect on the in-plane film thickness distribution of the SiON film formed on the wafer 200 (the effect of brining the in-plane film thickness distribution closer to the flat distribution or to the central convex distribution from the central-recessed distribution) at a first zone (in a region on the upper side in the wafer arrangement region in the wafer arrangement direction).

$$\text{(R1: HCDS+R3, Rt: } N_2 \rightarrow \text{R2: } O_2 \rightarrow \text{R2: } NH_3) \times$$
$$n \Rightarrow \text{SiON}$$

Further, for example, by supplying the $N_2$ gas from the nozzle 249e, in addition to the nozzle 249c, at the HCDS gas supply step as in the film-forming sequence illustrated below, it is possible to selectively enhance the aforementioned effect on the in-plane film thickness distribution of the SiON film formed on the wafer 200 at a third zone (in a region on the lower side in the wafer arrangement region in the wafer arrangement direction).

$$\text{(R1: HCDS+R3, Rb: } N_2 \rightarrow \text{R2: } O_2 \rightarrow \text{R2: } NH_3) \times$$
$$n \Rightarrow \text{SiON}$$

Modification 2

Figure 6:
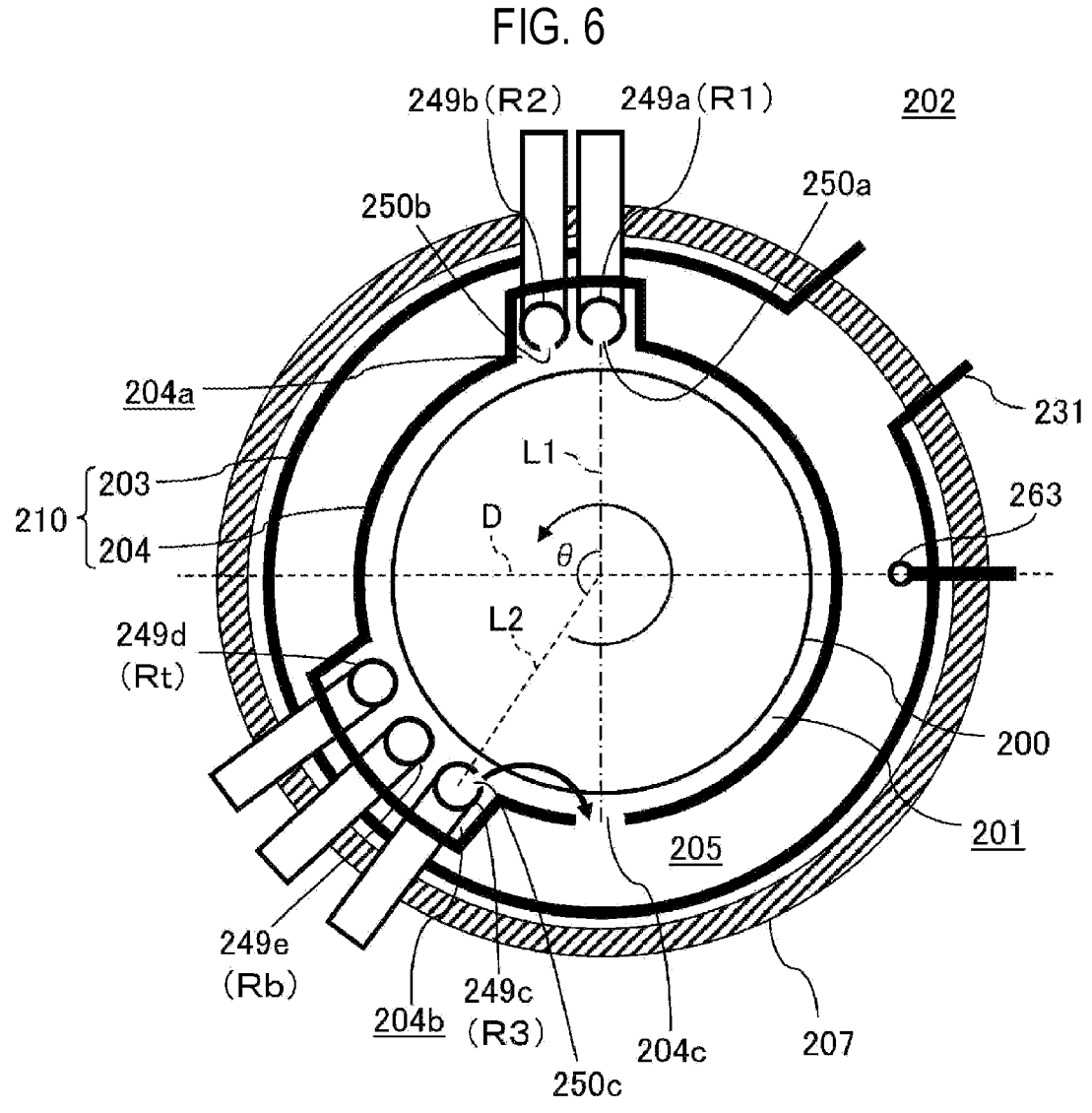
FIG. 6 is a schematic configuration diagram of an exemplary modification of a vertical process furnace of a substrate processing apparatus suitably used in some embodiments of the present disclosure.

The film-forming step is performed while rotating the wafer 200 as described above, and the $N_2$ gas may be injected from the nozzle 249c toward an edge side near the exhaust port 204c of the wafer 200 along the rotation direction of the wafer 200 at the HCDS gas supply step, as illustrated in FIG. 6.

That is, the gas injection holes 250c of the nozzle 249c may be opened outward toward the edge side of the wafer 200 near the exhaust port 204c along the rotation direction of the wafer 200. In this case, as illustrated in FIG. 6, an angle formed by the opening direction (gas injection direction) of the gas injection holes 250c of the nozzle 249c and the edge of the wafer 200 in the plane view becomes an acute angle.

Even in the modification, the same effects as those of the aforementioned substrate processing sequence illustrated in FIG. 4 may be achieved. Furthermore, according to the modification, it is possible to more appropriately suppress the arrival of the $N_2$ gas injected from the gas injection holes 250c to the center of the wafer 200. In addition, it is also possible to more efficiently supply the $N_2$ gas injected from the gas injection holes 250c to the outer peripheral portion of the wafer 200. As a result, it is possible to more reliably perform the aforementioned regulation of the in-plane film thickness distribution of the SiON film formed on the wafer 200.

Other Embodiments of the Present Disclosure

While the embodiments of the present disclosure have been specifically described above, the present disclosure is not limited to the aforementioned embodiments but may be variously modified without departing from the spirit of the present disclosure.

For example, a silicon oxide film (SiO film) and a silicon nitride film (SiN film), a silicon carbonitride film (SiCN film), a SiON film, a silicon oxycarbide film (SiOC film), a silicon oxycarbonitride film (SiOCN film), a silicon boronitride film (SiBN film), a silicon borocarbonitride film (SiBCN film), or the like may be formed on a substrate by using a N-containing gas such as a $NH_3$ gas, a carbon (C)—containing gas such as a propylene ($C_3H_6$) gas, a gas containing N and C such as a triethylamine (($C_2H_5$)$_3$N, abbreviation: TEA) gas, a boron (B)—containing gas such as a trichloroborane ($BCl_3$) gas, or the like, as the reactant, and by the film-forming sequences denoted below. Even in these cases, the same effects as those of the aforementioned embodiments may be achieved. Processing procedures and processing conditions when the reactants are supplied may be similar to, for example, those when the reactants in the aforementioned embodiments are supplied. Even in these cases, the same effects as those of the aforementioned embodiments may be achieved.

(R1: HCDS+R3: $N_2 \rightarrow$ R2: $O_2+H_2$)$\times n \Rightarrow$ SiO (R1: HCDS+R3: $N_2 \rightarrow$ R2: $NH_3$)$\times n \Rightarrow$ SiN (R1: HCDS+R3: $N_2 \rightarrow$ R2: TEA)$\times n \Rightarrow$ SiCN (R1: HCDS+R3: $N_2 \rightarrow$ R2: $NH_3 \rightarrow$ R2: $O_2$)$\times n \Rightarrow$ SiON (R1: HCDS+R3: $N_2 \rightarrow$ R2: TEA$\rightarrow$ R2: $O_2$)$\times n \Rightarrow$ SiOC(N)

(R1: HCDS+R3: $N_2 \rightarrow$ R2: $C_3H_6 \rightarrow$ R2: $NH_3 \rightarrow$ R2: $O_2$)$\times$
$n \Rightarrow$ SiOCN (R1: HCDS+R3: $N_2 \rightarrow$ R2: $C_3H_6 \rightarrow$ R2: $O_2 \rightarrow$ R2: $NH_3$)$\times$
$n \Rightarrow$ SiOCN (R1: HCDS+R3: $N_2 \rightarrow$ R2: $BCl_3 \rightarrow$ R2: $NH_3$)$\times n \Rightarrow$ SiBN (R1: HCDS+R3: $N_2 \rightarrow$ R2: $C_3H_6 \rightarrow$ R2: $BCl_3 \rightarrow$ R2: $NH_3$)$\times$
$n \Rightarrow$ SiBCN Further, for example, various films described above may be formed on the substrate by simultaneously suppling the precursor and the reactant to the substrate. In addition, for example, a silicon film (Si film) may be formed on the substrate by supplying only the precursor to the substrate. Even in these cases, the same effects as those of the aforementioned embodiments may be achieved. The processing procedures and processing conditions when these precursors and reactants are supplied may be similar to those when the precursors and the reactants in the aforementioned embodiments are supplied. In these cases, the same effects as those of the aforementioned embodiments may be achieved.

In addition, for example, a titanium oxide film (TiO film), an aluminum nitride film (TiN film), a titanium oxynitride film (TiON film), an aluminum oxide film (AlO film), an aluminum nitride film (AlN film), an aluminum oxynitride film (AlON film) or the like may be formed on the substrate by using a titanium tetrachloride (TiCl$_4$) gas, a trimethylaluminum $(Al(CH_3)_3,$ abbreviation: TMA) gas, or the like, as the precursor, and by the film-forming sequences denoted below. Even in these cases, the same effects as those of the aforementioned embodiments may be achieved. Processing procedures and processing conditions when these precursors and reactants are supplied may be similar to, for example, those when the precursors and the reactants in the aforementioned embodiments are supplied. In these cases, the same effects as those of the aforementioned embodiments may be achieved.

(R1: $TiCl_4$+R3: $N_2 \rightarrow$R2: $H_2O$)×n$\Rightarrow$TiO
(R1: $TiCl_4$+R3: $N_2 \rightarrow$R2: $NH_3$)×n$\Rightarrow$TiN
(R1: $TiCl_4$+R3: $N_2 \rightarrow$R2: $O_2 \rightarrow$R2: $NH_3$)×n$\Rightarrow$TiON
(R1: $TiCl_4$+R3: $N_2 \rightarrow$R2: $NH_3 \rightarrow$R2: $O_2$)×n$\Rightarrow$TiON
(R1: TMA+R3: $N_2 \rightarrow$R2: $H_2O$)×n$\Rightarrow$AlO
(R1: TMA+R3: $N_2 \rightarrow$R2: $N_3$)×n$\Rightarrow$AlN
(R1: TMA+R3: $N_2 \rightarrow$R2: $H_2O \rightarrow$R2: $NH_3$)×n$\Rightarrow$AlON
(R1: TMA+R3: $N_2 \rightarrow$R2: $NH_3 \rightarrow$R2: $H_2O$)×n$\Rightarrow$AlON Recipes used in substrate processing may be provided individually according to the processing contents and may be stored in the memory 121$c$ via a telecommunication line or the external memory 123. Moreover, at the start of substrate processing, the CPU 121$a$ may properly select an appropriate recipe from the recipes stored in the memory 121$c$ according to the contents of substrate processing. Thus, it is possible for a single substrate processing apparatus to form films of different types, composition ratios, qualities and thicknesses with enhanced reproducibility. In addition, it is possible to reduce an operator's burden and to quickly start the substrate processing while avoiding an operation error.

The recipes mentioned above are not limited to newly-provided ones but may be provided by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiments, there have been described examples in which films are formed by using a batch-type substrate processing apparatus capable of processing a plurality of substrates at a time. The present disclosure is not limited to the aforementioned embodiments but may be appropriately applied to, for example, a case where films are formed by using a single-wafer-type substrate processing apparatus capable of processing a single substrate or several substrates at a time. In addition, in the aforementioned embodiments, there have been described examples in which films are formed by using the substrate processing apparatus provided with a hot-wall-type process furnace. The present disclosure is not limited to the aforementioned embodiments but may be appropriately applied to a case where films are formed by using a substrate processing apparatus provided with a cold-wall-type process furnace. Even in the case of using these substrate processing apparatuses, a film-forming process may be performed under the sequences and processing conditions similar to those of the embodiments and modifications described above. Effects similar to those of the embodiments and modifications described above may be achieved.

These embodiments may be appropriately combined with one another. Processing procedures and processing conditions in that case may be similar to, for example, the processing procedures and processing conditions of the aforementioned embodiments.

EXAMPLES

A SiON film is formed on a wafer by performing a cycle which non-simultaneously supplies a HCDS gas, an $O_2$ gas, and a $NH_3$ gas to the wafer in this order a predetermined number of times by using the substrate processing apparatus illustrated in FIGS. 1, 2 and 5 and as in the film-forming sequence illustrated in FIG. 4. At this time, three SiON film samples (samples 1 to 3) are provided by performing the formation of the SiON film a plurality of times under different processing conditions. Flow rates of a $N_2$ gas from R2 and R3 at a HCDS gas supply step when each sample is provided are respectively set as follows. Other processing conditions when each sample is provided are set to predetermined conditions which fall within the processing condition range described in the aforementioned embodiments with reference to FIG. 4, which are common conditions in samples 1 to 3. That is, the sample 3 becomes the SiON film formed by the same processing procedures and processing conditions as those of the film-forming sequence illustrated in FIG. 4.

Figure 8A:
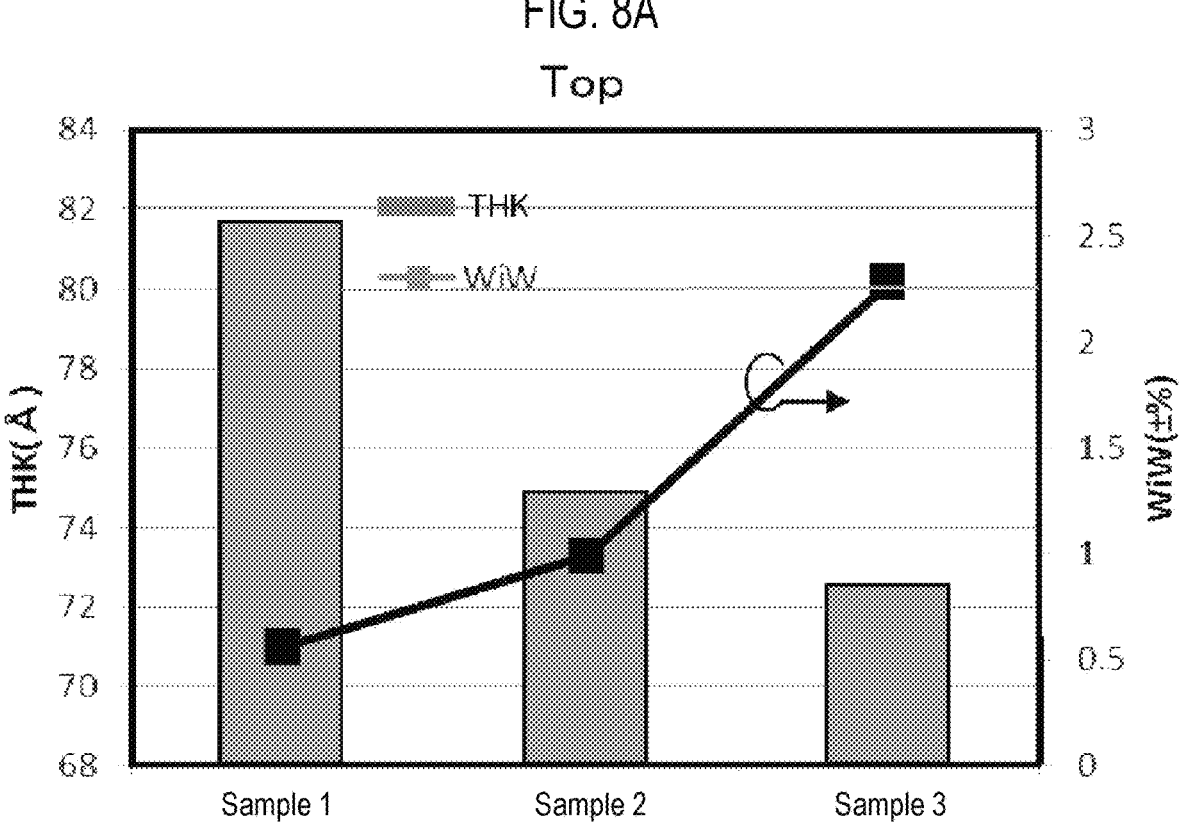
FIG. 8A is a diagram illustrating an average film thickness and a film thickness uniformity of a film formed on a substrate arranged in an upper portion of a substrate arrangement region in a plane of the substrate.

(Sample 1) R2: 0 slm, R3: 0 slm
(Sample 2) R2: 5 slm, R3: 0 slm
(Sample 3) R2: 0 slm, R3: 5 slm Then, an average film thickness (THK) and film thickness uniformity (WiW) of samples 1 to 3 in the plane of the wafer are respectively measured. FIGS. 8A to 8C sequentially illustrate measurement results on an upper side (Top), a center (Cen), and a lower side (Btm) in a wafer arrangement region. The horizontal axes in FIGS. 8A to 8C sequentially indicate samples 1 to 3. In FIGS. 8A to 8C, the left vertical axes indicate THK [A] and the right vertical axes indicate WiW [±%]. In each drawing, a columnar graph indicates THK and the ■ mark indicates WiW. The WiW indicates that a variation in film thickness in the plane of the wafer increases, as an absolute value of the WiW increases.

As illustrated in FIGS. 8A to 8C, THK decrease approximately in the order of samples 1 to 3 (THK of sample 3 is the smallest except for Btm). However, when comparing THK of sample 1 and THK of sample 3, it is found that a difference between them is about 10%. That is, it is confirmed that a practical deposition rate may be obtained even in the method of providing sample 3, that is, the aforementioned embodiments described with reference to FIG. 4.

As results of confirming each of the in-plane film thickness distributions of samples 1 to 3, it is confirmed that sample 1 has a central-recessed distribution in Top and Cen and a central convex distribution in Btm, sample 2 has a central-recessed distribution in Top and a central convex distribution in Cen and Btm, and sample 3 has a central convex distribution in any of Top, Cen and Btm. Further, as illustrated in FIGS. 8A to 8C, WiW increases in the order of samples 1 to 3 such that a degree of the central convex distribution becomes stronger (the degree of the central convex distribution of sample 3 is the strongest). That is, it is confirmed that it is possible to regulate the in-plane film thickness distribution of the SiON film formed on the wafer, specifically to bring the in-plane film thickness distribution closer to the flat distribution or to the central convex distribution from the central-recessed distribution, by using the method of providing sample 3, that is, the aforementioned embodiments described with reference to FIG. 4.

According to the present disclosure in some embodiments, it is possible to control in-plane film thickness uniformity of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:

forming a film on the substrate in a process chamber by performing a cycle a predetermined number of times, the cycle including:

(a) while rotating the substrate in the process chamber, supplying a precursor from a first supplier to the substrate and exhausting the precursor from an exhaust port installed opposite to the first supplier with the substrate interposed between the exhaust port and the first supplier; and (b) while rotating the substrate in the process chamber, supplying a reactant from a second supplier to the substrate and exhausting the reactant from the exhaust port, wherein while the precursor is being supplied in (a), an inert gas is supplied into the process chamber from a third supplier installed at a region, which is a region on a side of the exhaust port among a plurality of regions partitioned in the process chamber by a bisector perpendicular to a straight line connecting the first supplier and the exhaust port in a plane view, by being injected toward an edge of the substrate near the exhaust port along a rotation direction of the substrate, and wherein a gas injection hole of the third supplier is formed such that an angle formed by a gas injection direction from the gas injection hole and an edge of the substrate in the plane view is an acute angle.

2. The method according to claim 1, wherein in (a), an in-plane film thickness distribution of the film formed on the substrate is regulated by controlling a flow rate of the inert gas supplied from the third supplier.

3. The method according to claim 1, wherein a position where the third supplier is disposed is closer to the exhaust port than a position where the first supplier is disposed.

4. The method according to claim 1, wherein a distance between the third supplier and the exhaust port is shorter than a distance between the first supplier and the exhaust port.

5. The method according to claim 1, wherein a position where the third supplier is disposed is closer to the exhaust port than a position where the second supplier is disposed.

6. The method according to claim 1, wherein a distance between the third supplier and the exhaust port is shorter than a distance between the second supplier and the exhaust port.

7. The method according to claim 1, wherein a position where the third supplier is installed is farther from the first supplier than a position where the second supplier is installed.

8. The method according to claim 1, wherein a distance between the third supplier and the first supplier is longer than a distance between the second supplier and the first supplier.

9. The method according to claim 1, wherein the second supplier is installed opposite to the exhaust port with the substrate interposed between the second supplier and the exhaust port.

10. The method according to claim 1, wherein the second supplier is installed adjacent to the first supplier.

11. The method according to claim 1, wherein in (a), a flow rate of the inert gas supplied from the third supplier is set larger than a flow rate of the precursor supplied from the first supplier.

12. The method according to claim 1, wherein in (a), the inert gas is supplied from the first supplier, and a flow rate of the inert gas supplied from the third supplier is set larger than a flow rate of the inert gas supplied from the first supplier.

13. The method according to claim 1, wherein in (a), the inert gas is supplied from the first supplier, and a flow rate of the inert gas supplied from the third supplier is set larger than a total flow rate of the precursor and the inert gas supplied from the first supplier.

14. The method according to claim 1, wherein in (a), the inert gas is supplied from the second supplier, and a flow rate of the inert gas supplied from the third supplier is set larger than a flow rate of the inert gas supplied from the second supplier.

15. The method according to claim 1, wherein the inert gas is supplied from the third supplier in (b), and a flow rate of the inert gas supplied from the third supplier in (a) is set larger than a flow rate of the inert gas supplied from the third supplier in (b).

16. The method according to claim 1, wherein in (a), the precursor is supplied from the first supplier to the substrate such that the precursor reaches the substrate from a side of the substrate and the inert gas is supplied from the third supplier to the substrate such that the inert gas reaches the substrate from the side of the substrate.

17. The method according to claim 1, wherein a pattern including a recess is formed on a surface of the substrate.

18. The method according to claim 1, wherein the reactant includes a first reactant, and wherein the cycle further includes performing (c) supplying a second reactant having a molecular structure, which is different from that of the first reactant, from the second supplier to the substrate in the process chamber and exhausting the second reactant from the exhaust port.

19. A method of manufacturing a semiconductor device comprising the method of claim 1.

* * * * *